United States Patent
Zipper et al.

(10) Patent No.: US 6,570,947 B1
(45) Date of Patent: May 27, 2003

(54) PHASE LOCK LOOP HAVING A ROBUST BANDWIDTH AND A CALIBRATION METHOD THEREOF

(75) Inventors: Eliav Zipper, Ramat Gan (IL); Michael Zarubinsky, Jerusalem (IL); Yachin Afek, Cfar Saba (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/404,933

(22) Filed: Sep. 24, 1999

(51) Int. Cl.$^7$ ............................... H03D 3/24; H03L 7/08
(52) U.S. Cl. .................. 375/376; 327/156; 331/11; 331/17
(58) Field of Search .................. 375/327, 376; 327/156, 159; 329/307; 331/2, 11, 16, 17, 177 R

(56) References Cited

U.S. PATENT DOCUMENTS

| | | | |
|---|---|---|---|
| 4,380,742 A | 4/1983 | Hart | 331/1 A |
| 5,079,521 A | 1/1992 | Gaskell et al. | 331/1 A |
| 5,105,160 A | 4/1992 | Summers | 328/133 |
| 5,111,151 A | 5/1992 | Ii | 328/155 |
| 5,168,245 A | 12/1992 | Koskowich | 331/1 A |
| 5,173,617 A | 12/1992 | Alsup et al. | 307/269 |
| 5,268,653 A | 12/1993 | Lafon | 331/1 A |
| 5,347,234 A | 9/1994 | Gersbach et al. | 331/57 |
| 5,349,311 A | 9/1994 | Mentzer | 331/57 |
| 5,382,922 A | 1/1995 | Gersbach et al. | 331/1 A |
| 5,574,455 A | 11/1996 | Hori et al. | 341/144 |
| 5,625,358 A | 4/1997 | Wilson et al. | 341/143 |
| 5,654,675 A | 8/1997 | Bruccoleri et al. | 331/17 |
| 5,668,503 A | 9/1997 | Gersbach et al. | 331/1 A |
| 5,727,038 A | 3/1998 | May et al. | 375/376 |
| 5,745,533 A | 4/1998 | Asada et al. | 375/354 |
| 5,748,043 A | 5/1998 | Koslov | 331/1 A |
| 5,844,447 A | 12/1998 | Choi | 331/57 |
| 5,844,954 A | 12/1998 | Casasanta et al. | 375/373 |
| 5,856,762 A | 1/1999 | Werker et al. | 331/11 |
| 5,867,333 A | * 2/1999 | Saiki et al. | 360/51 |
| 5,892,406 A | 4/1999 | Dicke et al. | 331/40 |
| 5,986,485 A | * 11/1999 | O'Sullivan | 327/156 |
| 6,005,425 A | * 12/1999 | Cho | 327/156 |
| 6,150,887 A | * 11/2000 | Yamaguchi | 331/11 |

* cited by examiner

Primary Examiner—Young T. Tse

(57) ABSTRACT

A phase lock loop having an bandwidth that does not depend upon N. The phase lock loop comprising: a controlled oscillator, a frequency divider by N, a phase detector for producing an error signal ER, and an adjustable converter, coupled to the phase detector and to the current controlled oscillator, for receiving ER and providing the controlled oscillator a control signal such that that the (Fico/N) ranges between a minimum value of Fmin and a maximal value of Fmax, wherein Fref=(Fmin+Fmax)/2.

11 Claims, 3 Drawing Sheets

120

PHASE LOCK LOOP HAVING A ROBUST BANDWIDTH AND A CALIBRATION METHOD THEREOF

FIELD OF THE INVENTION

A method and system for calibrating a phase lock loop having a robust bandwidth.

BACKGROUND OF THE INVENTION

Phase lock loops (i.e.—PLLs) are used in a variety of integrated circuits. Prior art PLLs are comprised of a phase detector, a loop filter, a frequency divider and either one of the following types of controlled oscillators: voltage controlled oscillator (VCO), digital controlled oscillator (DCO) or current controlled oscillator (ICO). A frequency of an output signal of a controlled oscillator is responsive to a control signal provided to the controlled oscillator. The frequency divider receives an output signal provided by a controlled oscillator having a frequency of Fvco and outputs a signal having frequency of (Fvco/N). Usually, N is proportional to Fvco, and it ranges between Nmin and Nmax, where Nmax>>Nmin.

Usually, Nmax>NminX8. Prior art PLL have a transfer function Hpa(s) that is characterized by having a bandwidth BWpa (N) that is dependant upon the value of N. BWpa (N) ranges from a minimum of BWmin to a maximum of BWmax, wherein BWmin>BWmax, larger values of N result in a narrower bandwidth.

On one hand, a large bandwidth allows the PLL to respond in a quick manner to eventual frequency and/or phase errors and minimize jitter. On the other hand, narrow bandwidth is required in order to achieve good rejection capability of high frequency noise. Narrow bandwidth allows to reject high frequency fluctuations in clock signals and jitter resulting from the frequency division performed by the frequency divider.

In prior art PLL it is difficult to reconcile these contrasting requirements. Usually, BWmax has to be narrow enough so that the PLL has a good rejection capability of high frequency noise and BWmin has to be large enough to allow quick response to eventual frequency and/or phase errors.

U.S. Pat. No. 5,382,922 of Gerbach et al discloses a system and method for calibrating a PLL and to provide a precise setting of the center frequency of a VCO. As seen in FIG. 1 of U.S. Pat. No. 5,382,922, the PLL includes a phase detector, a charge pump, a loop filter, a voltage to current converter, an ICO and a calibration circuit. Although FIG. 1 does not disclose a frequency divider, such a frequency divider is disclosed in FIG. 3. The calibration involves adding a bias current to the input of the ICO, the bias current is calculated so that the PLL will output a central frequency at the middle of a control voltage range, the control voltage range is provided by the charge pump. The calibration circuit includes two comparators that indicate whether the control voltage Vc is below or above two reference signals VR1 and VR2, where VR1>VR2, which are usually chosen near the central frequency. The calibration process involves adjusting the bias current according to the relations between VR1, VR2 and Vc. If Vc<VR1 the bias current is lowered, if Vc>Vr2 the current bias is increased. Usually the calibration process involves a plurality of adjustments, whereas after each adjustment the PLL has to perform a phase lock. Thus, the calibration procedure is relatively long, the calibration circuit is provided with a clock CAL_CLK having a period that is much longer than the period in which a PLL performs a frequency/phase lock. The calibration takes several CAL_CLK periods. Another disadvantage of the PLL disclosed in U.S. Pat. No. 5,382,922 is that is does not adjust itself to changes in N, thus the frequency range, and accordingly the frequency step are fixed.

Component tolerances and process variations often result in a wide range of possible controlled oscillator gain and loop filter gain that can decrease the dynamic range of the PLL. It is desirable to have a PLL that has a dynamic range that is less sensitive to these tolerances and variations.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

An aspect of the invention is a fast calibration process that enables the PLL to output signals within a local range, whereas the boundaries of the range, the jitter and the open loop gain are dependent upon 1/N. Preferably, FREF is located in the middle of the range allowing optimal dynamic range.

Figure 1:
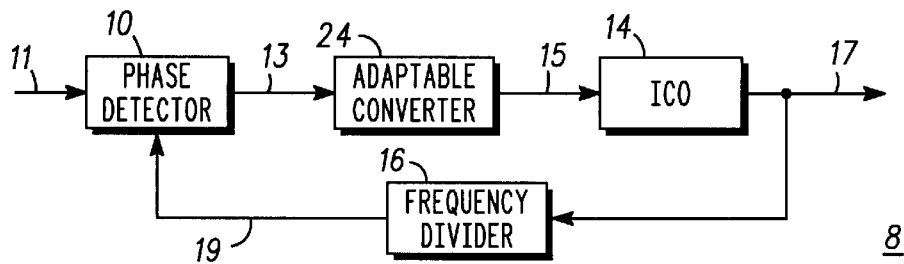
FIG. 1 is a schematic description of a PLL, according to a preferred embodiment of the invention.

FIG. 1 is a schematic description of PLL 8 according to a preferred embodiment of the invention. PLL 8 is comprised of phase detector 10, an adaptable converter 24, a frequency divider 16 and ICO 14. For convenience of explanation PLL 8 can comprise a VCO or a DCO instead the ICO 14, but for convenience of explanation it is assumed that ICO is current controlled. Phase detector 10 is coupled to adaptable converter 24 via bus 13, to frequency divider 16 via bus 19 and to a reference clock generator (not shown in FIG. 1) via bus 11. ICO 14 is coupled to adaptable converter 24 via bus 15 and to frequency divider 16 by bus 17.

The output signals of PLL 8 are provided by ICO 14, via bus 17. The phase detector 10 receives a reference signal REF from reference clock generator having a frequency of Fref and an output signal FD having a frequency of Ffd=

(Fico/N) from frequency divider 16. Phase detector 10 outputs a digital error signal ERS reflecting the phase (frequency) difference between Fref and Fico/N.

ERS is received by adaptable converter 24 that amplifies and converts ERS to an analog signal AS. As explained in further details in reference to FIGS. 2–5 the adjustable converter has an adjustable gain, and it amplifies ERS so that Fico is within a local range and FREF is located in the middle of that local range. If for example, AS can range between ASmax and ASmin than upon a reception of an analog signal of (ASmax+ASmin)/2 (Fico/N)≈Fref.

AS is sent to ICO 14 wherein it is converted to an output signal SICO, having frequency of Fico. A frequency lock is achieved when (Fico/N) equals Fref, or when the difference between these two frequencies is negligible. A phase lock is usually achieved after a frequency lock is achieved, whereas there is no phase difference or there is a neglible phase difference between FD and REF.

Usually the performance of the phase lock requires additional circuitry, such as an additional integrator or loop filter, coupled to phase detector 10 and adaptable converter 24. The additional circuitry does not alter the calibration method. The calibration method does not alter when a loop filter, or any sort of additional circuitry that has a transfer function that is not dependent upon N, is added to PLL 8. PLL 8 performs a frequency and phase lock when it is initialized, when N is altered and when Fref changes. The transfer function $Hi\phi(s)$ of PLL 8 can be described by the following equation:

$$Hi\phi(s)=(Kpd*Kac*Kico*Hadd)/(1+(Kpd*Kac*Kico*Hadd)/N)).$$

Kpd [volts/radians] is the gain of phase detector 10, Kac [Ampere/Volts] is the gain of adaptive converter 24, Kico [Hz/Ampere] is the gain of ICO 14, Hadd is the transfer function of an additional circuitry such as a loop filter. Hadd, Kpd and Kico do not depend on N. Conveniently, in order to produce a transfer function that is does not depend upon N, Kac has to be proportional to 1/N.

Preferably, and as shown in further details in reference to FIGS. 2–5, adaptive converter 24 changes its gain Kac so that it compensates both for the change of N and for changes in Kico.

Figure 2:
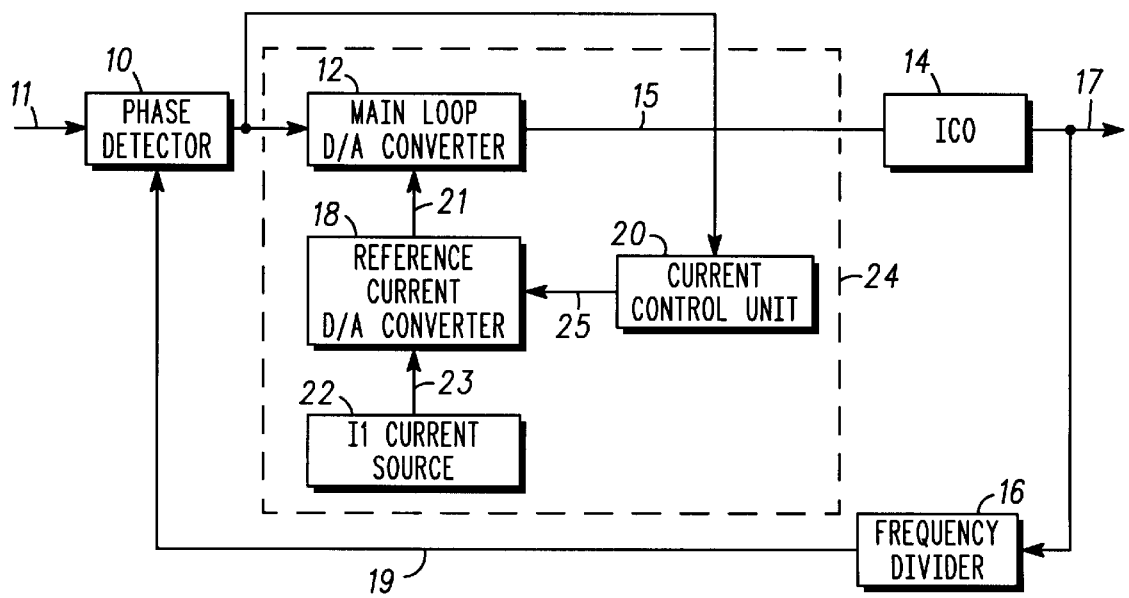
FIG. 2 is a detailed schematic description of a PLL, according to a preferred embodiment of the invention.

Referring to FIG. 2, adaptive converter 24 is comprised of a main loop digital to analog converter (DAC) 12, and an adjustable current source. The adjustable current source further comprises: a current control unit 20, a current reference DAC 18 and a fixed current source 22. The phase detector 10 is coupled to main loop DAC 12 via bus 13, to frequency divider 16 via bus 19 and a reference clock generator (not shown in FIG. 1) via bus 11. ICO 14 is coupled to main loop DAC 12 via bus 15 and to frequency divider 16 via bus 17. ICO 14 is adapted to be coupled to external elements (not shown in FIG. 1) via bus 17. Current reference DAC 18 is coupled to current control unit 20 via bus 25, to current source 22 via bus 23 and to main loop DAC 12 via bus 21. Main loop DAC 12 is coupled to current control unit 20 via bus 15.

Conveniently, current control unit 20 is activated only when PLL 8 performs a frequency lock. Current control unit 20 receives the error signals from phase detector 10 and adjusts the current provided to ICO 14. After the adjustment procedure current control unit is not active and current reference DAC 18 outputs a fixed output signal to main loop DAC 12. After the current control unit 20 is deactivated, phase detector 10 receives a reference signal REF from reference clock generator having a frequency of Fref and an output signal FD having a frequency of Ffd=(Fico/N) from frequency divider 16. Phase detector 10 outputs a digital error signal ERS reflecting the phase difference and accordingly the frequency difference between the REF (Fref) and FD (Fico/N). ERS is received by main loop DAC 12 and is converted to an analog signal AS being proportional to ERS. DCO 14 receives AS and outputs an output signal ICOS having a frequency of Fdco that is proportional to AS. Frequency divider 16 converts ICOS to the output signal FD.

Figure 3:
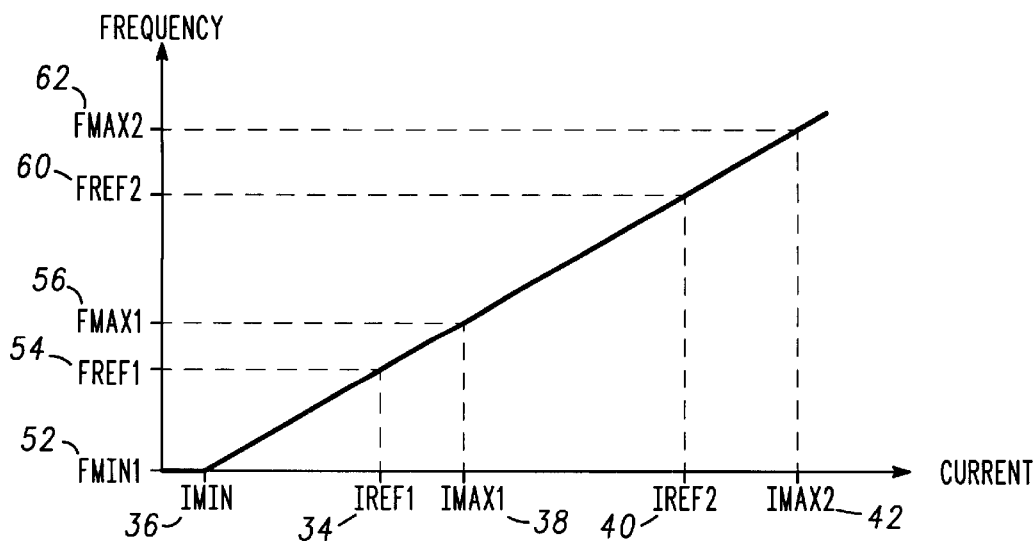
FIG. 3 is a rough schematic description of the characteristic of a current controlled oscillator, according to a preferred embodiment of the invention.

FIG. 3 is a rough schematic description of the characteristic of ICO 14, wherein the Fico has minimum and a maximum values of Fmin and Fmax, resulting from supplying ICO 14 input signals having values of Imin and Imax accordingly. Two exemplary local ranges are also shown, the first range starts at Fmin and ends at Fmax1 and the second local range starts at Fmin and ends at Fmax2. ICO 14 provides output signals having frequencies of Fmin, Fmax1 and Fmax2 when it is provided with an input signal Imin, Imax1 and Imax2. The center frequency of the first range is Fref1, while the center frequency of the second local range is Fref2. As explained in further details in reference to FIG. 4, main loop DAC 12 can output an output signal having a limited number of possible values. The difference between two consecutive values of the output signal is referred to as a current step. Changing the signal provided to ICO 14 by a current step results in a change in the frequency of DICO. This change is referred to as a frequency step Fstep.

For example, if main loop DAC 12 utilizes Q binary-weighted current sources, it can provide an output signal that has $(2^Q-1)$ discrete values. If the main loop DAC 12 utilized Q equally weighted current sources it can provide an output signal that has Q possible values. When the reference signal is of a frequency of Fref1, [Fref2] main loop DAC 12 will provide an output signal that ranges between Imin and Imax1 [Imax2], and if the main loop DAC 12 uses binary weighted current sources, the magnitude of each current step will be: $(Imax1-Imax1)/(2^Q-1)[(Imax2-Imin)/(2^Q-1)]$. Thus, a frequency step equals $(Fmax1-Fmin)/(2^Q-1)$ $[(Fmax2-Fmin)/(2^Q-1)]$, accordingly.

Figure 4:
FIG. 4 is a schematic time diagram showing the output of the current controlled oscillator, according to a preferred embodiment of the invention.

As shown in FIGS. 4–5, and as a result of the limited number of discrete values provided by main loop DAC, PLL 8 provides a required frequency Fref by switching between two discrete frequencies, such that the average value yields the required frequency. For example, if Fref2=((7*Fnom2)+ 3*(Fnom2+Fstep2))/10 ICO 14 will provide Fnom2 for 70% of the time. (T2 82−T1 80)/(T3 84−T1 80)=70%.

Figure 5A:
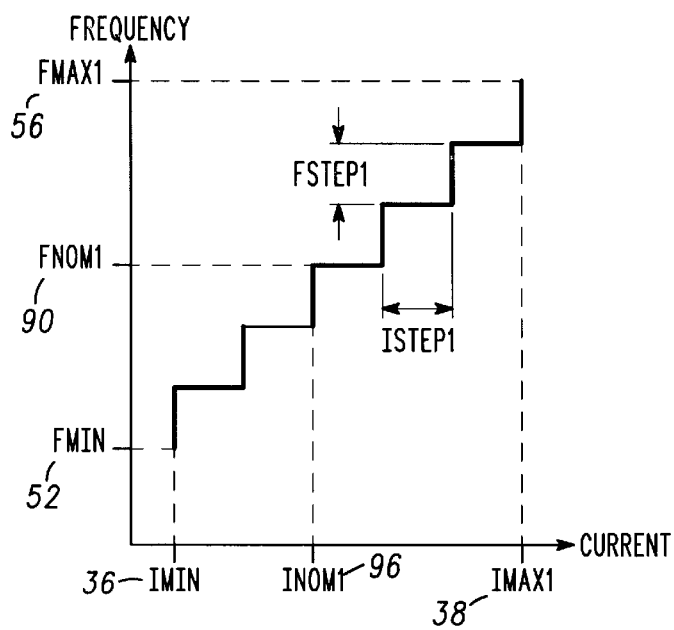
FIGS. 5A and 5B are a rough schematic description of a portion of the characteristic of a current controlled oscillator, according to a preferred embodiment of the invention.
Figure 5B:
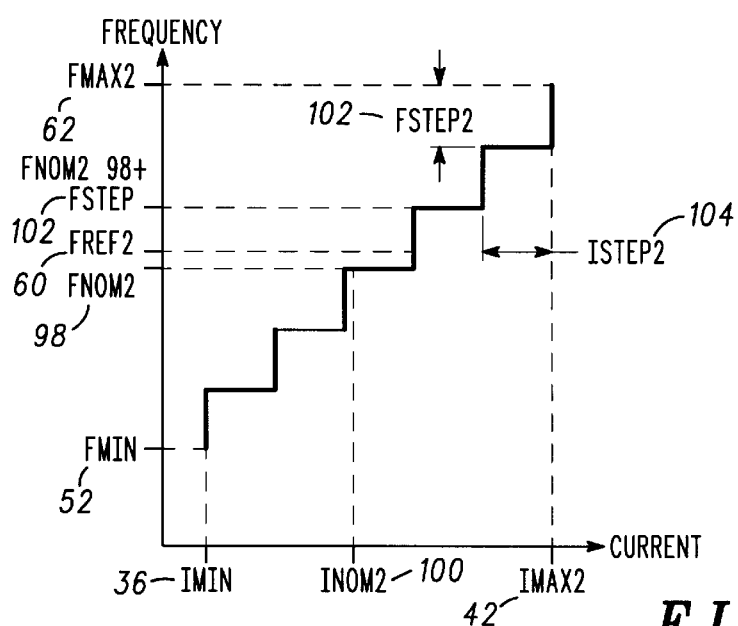

As can be seen from FIG. 5A, the output signal provided by VCO has a frequency (nominally FNOM1 90) which varies from FMIN 52 to FMAX1 56 in steps FSTEP1 as the current (nominally INOM1 96) varies from IMIN 36 to IMAXI 38 in steps ISTEP1. As can be seen from FIG. 5B, the output signal provided by VCO has a jitter of FSTEP2. Smaller frequency steps result in lower jitter. On the other hand smaller frequency steps limit the dynamic range of the PLL. These requirements are reconciled by adjusting the frequency step and the local range to a nominal frequency Fnom. Fmon is located in the middle of the local range, so that PLL 8 can respond to both positive and negative variations in the frequency and phase of REF and PD. Preferably, Fnom≈Fref, and the frequency step is proportional to 1/N. Thus, this adjustment causes the bandwidth of the PLL to be independent upon N.

Current source 22 provides a current I1 to current reference DAC 18, current reference DAC 18 receives from current control unit 20 a control word CWR, having value of WR, and multiplies current I1 by WR, thus providing main loop DAC 12 a current I1*WR. Main loop DAC 12 receives from phase detector 10 an error singal ERS, having value of ER and provides ICO 14 a current of I1*WR*ER.

Figure 6:
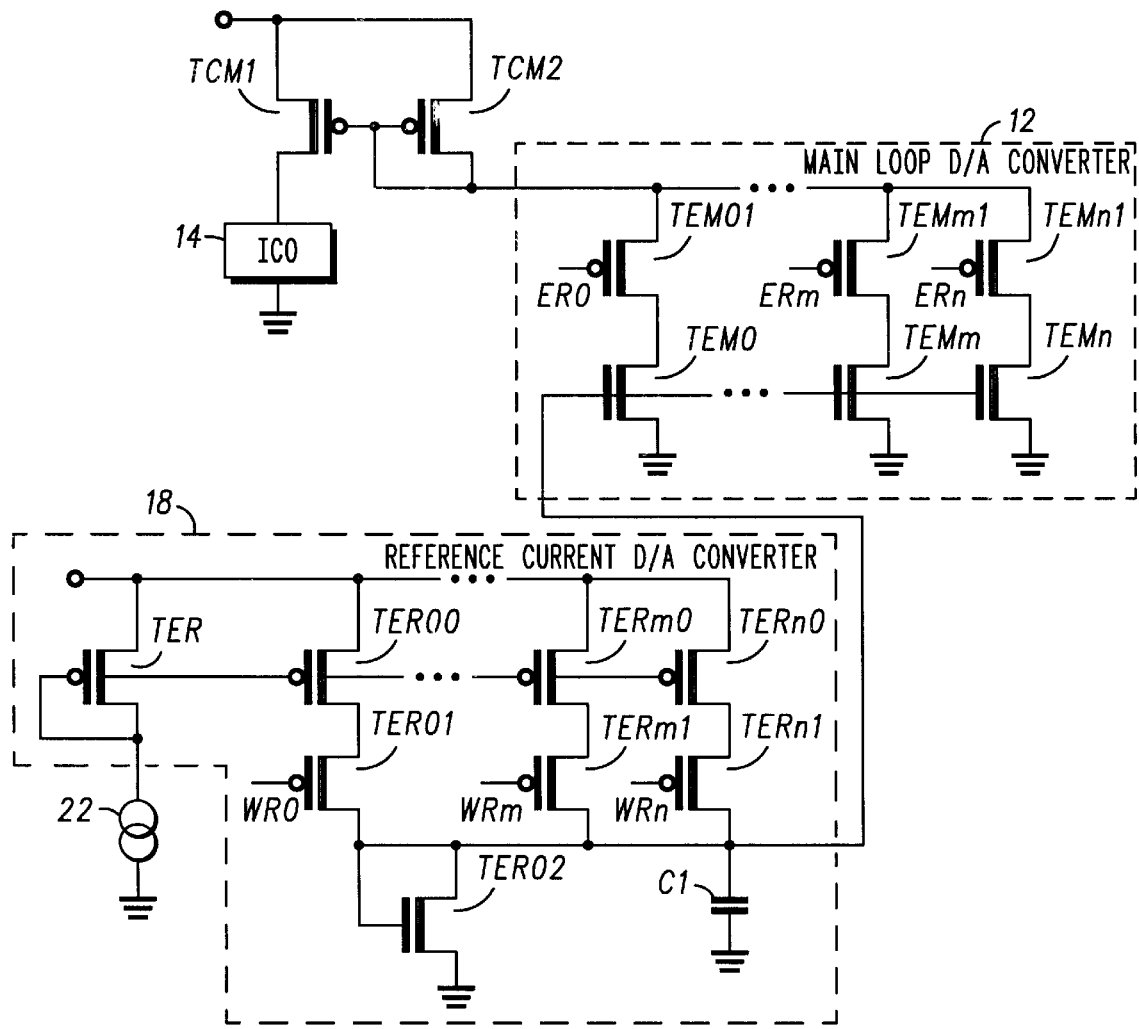
FIG. 6 is a detailed schematic description of a main loop DAC and a current control DAC, coupled to the current controlled oscillator and a current reference, according to preferred embodiment of the invention.

FIG. 6 is a detailed schematic description of main loop DAC 12, current control DAC 18, ICO 14 and current reference 22, according to preferred embodiment of the invention. Main loop DAC 12 provides a current of I1*WR*ER to ICO 14, via a current mirror having transistors TCM1 and TCM2.

Current reference 22 provides a current of I1 to the drain of p-channel transistor TER. The gate of TER is coupled in parallel to the gates of a plurality of p-channel transistors TER00–TERn0, forming a current mirror, wherein the current in each drain of TER00–TERn0 equals I1. The drains of transistors TER00–TERn0 are coupled to the sources of a plurality of p-channel transistors TER01–TERn1. The gates of transistors TER01–TERn1 are coupled to current control unit 20, for receiving control word WR, wherein each bit of WR is coupled to a gate of a transistor out of transistors TER01–TERn1. All the drains of transistors are coupled to each other, thus allowing the current provided from their drains to be summed. TER01–TERn1 are used as switches—they either allows current I1 to pass from their source to their drain or disable that passage.

Preferably, a capacitor C1 is coupled to the drains of transistors TER01–TERn1, in order to smooth the summed current (I1*WR), provided to current reference DAC 18.

The summed current (I1*WR) or the smoothed summed current is fed to the gates of a plurality of n-channel transistors TEM0–TEMn, which are coupled in parallel. The sources of transistors TEM0–TEMn are coupled to the drains of a plurality of p-channel transistors TEM01–TEMn1. The gates of transistors TEM01–TEMn1 are coupled to phase detector 10, for receiving error signal ER, wherein each bit of ER is coupled to a gate of a transistor out of transistors TEM01–TEMn1. All the sources of transistors are coupled to each other and to the current mirror, thus allowing to sum the current provided from their sources and provide that current to the current source. TEM01–TEMn1 are used as switches—they either allow smoothed summed current (I1*WR) to pass from their drain source or disable that passage. The current mirror comprising of transistor TCM1 and TCM2, for receiving a summed current I1*ER*WR and providing that current to ICO 14.

Figure 7:
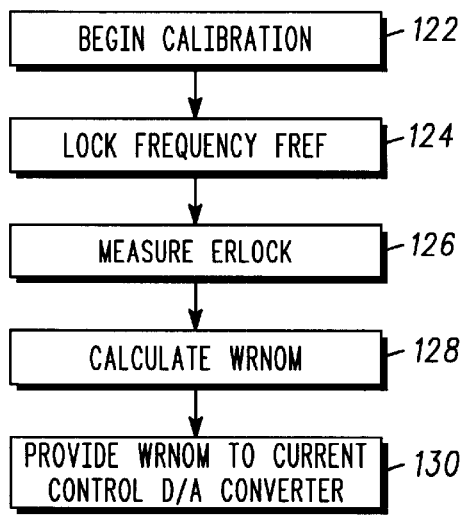
FIG. 7 is a flow chart of a method for calibrating the PLL, according to preferred embodiment of the invention.

FIG. 7 is a flow chart of a method 120 for calibrating a PLL, according to preferred embodiment of the invention. Method 120 comprises the following steps:

Starting calibration, during step 122 "Begin calibration" when N is changed, Fref is altered or when PLL 8 is initialized. Preferably, current control unit 20 receives a control signal from another control unit (not shown in FIGS. 1–7). Accordingly, providing a predetermined control signal WRinit to current reference DAC 18.

Performing a frequency lock, during step 124 "lock frequency Fref".

Measuring the error signal ERlock provided to main loop DAC 12, as a result of the frequency lock, during step 126 "measure ERlock".

Calculating, during step 128 "Calculate WRnom", a nominal control word WRnom to be provided to current reference DAC 18, so that when a predetermined control signal ERnom is provided to main loop DAC 12, ICO 14 will output a nominal frequency Fnom*N. Whereas WRnom*ERnom=WRinit*ERlock.

Providing, during step 130 "Provide WRnom to current control DAC", WRnom to current control DAC 18.

Thus, a current step will equal I1*WRnom and the frequency step will equal I1*WRnom*Kvco. Because N depends upon Fref (N is selected so that Fref≈Fico/N) and WRnom tracks the selected Fref, the frequency step is proportional to 1/N. Conveniently, Fref≈Fnom.

As a result of the calibration, ICO 14 can output signals having frequencies that range from Fmin to 2*NFnom, where N*Fnom(≈N*Fref) is located in the middle of the range and the frequency step is I1*WRnom*Kvco.

The calibration compensates for component tolerances and process variations because the calibration involves a frequency lock. These tolerances and variations can influence ERlock, but ERlock is measured so that the variations are taken into account. The calculation of WRnom is based upon Erlock, so that the PLL actually outputs a signal that tracks Fref. Furthermore, after the calibration is finished Fnom is located in the middle of the frequency range, thus insuring an optimal dynamic range.

The calibration method can be performed during any time period in which stable operation of the PLL 8 is not required. Because the execution of calibration method is relatively quick, this time period is relatively small.

An aspect of the invention is the usage of a Main loop DAC 12 and current reference DAC 18. Main loop DAC operates in a relatively high frequency Fref, thus it is relatively expensive and its elements are relatively large. Current reference DAC 18 is active during the calibration, thus is can operate in much lower frequencies, and it can be made of relatively cheap and small components. Preferably, a capacitor is coupled in parallel to the output of current reference, for smoothing the current provided to main loop DAC 12.

Thus, there has been described herein an embodiment including at least one preferred embodiment of an improved method and apparatus for calibrating a PLL. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

We claim:

1. A phase lock loop comprising:
    a controlled oscillator, adapted to receive a control signal and to provide an output signal ICOS having a frequency Fico, Fico is responsive to the control signal;
    a frequency divider, coupled to the controlled oscillator, for receiving ICOS and producing an output signal PD, having a frequency Fpd, wherein Fpd=Fico/N;
    a phase detector, adapted to receive a reference clock signal REF, having frequency Fref, the phase detector is coupled to the frequency divider, for producing an error signal ER proportional to the phase difference between REF and PD; and
    an adjustable converter, coupled to the phase detector and to the controlled oscillator, for receiving ER and providing to the controlled oscillator a control signal representative of a product of ER and a reference signal such that Fico is within a local range and Fref is statistically located in the middle of the local range.

2. The phase lock loop of claim 1 wherein the gain of the adjustable converter is proportional to 1/N.

3. The phase lock loop of claim 1 wherein the controlled oscillator is a current controlled oscillator and the adjustable converter comprises:

a main loop DAC, coupled to the phase detector and the current controlled oscillator, for converting the error signal ER to an analog control signal AS, ER ranging from a maximal value of ERmax to a minimal value of ERmin;

an adjustable current source, for providing a reference current Iref to the main loop DAC, to be multiplied by ER, wherein providing Iref and a nominal error signal ERnom=(ERmax+ERmin)/2 to main loop DAC causes the current controlled oscillator to output a signal having a frequency of Fico=Fref*N.

4. The phase lock loop of claim 3 wherein the adjustable current source comprises:

a current source, for providing a fixed current I1;

a current control unit, for providing a control word WR; and a current reference DAC, coupled to the current source and to the current control unit, for receiving WR and for providing Iref, wherein Iref=I1*WR.

5. The phase lock loop of claim 4 wherein the main loop DAC is adapted to operate in higher frequencies than the current reference DAC.

6. The phase lock loop of claim 4 wherein the main loop DAC and the current reference DAC have a plurality of equally weighted current sources.

7. The phase locked loop of claim 3 wherein a capacitor is coupled to the output of the adjustable current source, for smoothing Iref.

8. A method for calibrating a phase lock loop, the phase lock loop having a phase detector for producing an error signal ER, a current controlled oscillator, a frequency divider, a main loop DAC, and an adaptable current source, the adaptable current source providing to the main loop DAC reference current Iref, the main loop DAC providing to the current controlled oscillator an analog signal AS representative of a product of the error signal ER and Iref, the method comprising of the steps of:

providing a predetermined value of the reference current to the main loop DAC, performing a frequency lock;

measuring the error signal ER provided by the phase detector to the main loop DAC, as a result of the frequency lock;

calculating a nominal value of the reference current to be provided to the main loop DAC, so that when a predetermined value of the control signal is provided to the main loop DAC, the current controlled oscillator will output a signal having a nominal frequency; and providing the nominal value reference current to the main loop DAC.

9. The method of claim 8 wherein the adjustable current source comprises a current source, for providing a fixed current I1; a current control unit, for providing a control word WR, for determining the size of Iref; and a current reference DAC, coupled to the current source and the current control unit, for receiving WR and for providing Iref, wherein Iref=I*WR, wherein the step of providing the nominal value reference current involves providing a predetermined control word WRinit to the current reference DAC; and wherein the step of calculating the nominal value of the reference current involves calculating a nominal control word WRnom to be provided to the current reference DAC.

10. The method of claim 8 wherein the calibration method is started when either of the following events occurs:

the phase lock loop is initialized;

the frequency divider used in calculating the nominal value of the reference current changes a division factor N; and a frequency of a reference signal Fref is changed.

11. The method of claim 8 wherein the calibration method is started in any time period in which a stable operation of the phase lock loop is not required.

* * * * *

UNITED STATES PATENT AND TRADEMARK OFFICE
CERTIFICATE OF CORRECTION

PATENT NO.   : 6,570,947 B1
DATED        : May 27, 2003
INVENTOR(S)  : Eliav Zipper; Michael Zarubinsky and Yachin Afek It is certified that error appears in the above-identified patent and that said Letters Patent is hereby corrected as shown below:

<u>Column 8,</u>
Line 19, replace "Iref=I*WR," with -- Iref=Il*WR, --.

Signed and Sealed this

Thirtieth Day of September, 2003

JAMES E. ROGAN
*Director of the United States Patent and Trademark Office*